United States Patent
Erhardt et al.

(10) Patent No.: US 6,513,151 B1
(45) Date of Patent: Jan. 28, 2003

(54) FULL FLOW FOCUS EXPOSURE MATRIX ANALYSIS AND ELECTRICAL TESTING FOR NEW PRODUCT MASK EVALUATION

(75) Inventors: Jeff Erhardt, San Jose, CA (US); Khoi Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 193 days.

(21) Appl. No.: 09/794,503

(22) Filed: Feb. 26, 2001

Related U.S. Application Data

(60) Provisional application No. 60/232,976, filed on Sep. 14, 2000.

(51) Int. Cl.$^7$ .......................... G06F 17/50; G06F 19/00; G03F 9/02; G21K 5/00; G06K 9/74

(52) U.S. Cl. .......................... 716/21; 700/110; 700/120; 700/121; 430/5; 378/35; 382/144; 382/149

(58) Field of Search .............. 716/19–21; 700/108–111, 700/117–121; 430/4–5; 378/34–35; 382/141–152

(56) References Cited

U.S. PATENT DOCUMENTS

| | | | | |
|---|---|---|---|---|
| 5,308,722 A | * | 5/1994 | Nistler | 430/5 |
| 5,538,833 A | * | 7/1996 | Ferguson et al. | 430/325 |
| 5,888,675 A | * | 3/1999 | Moore et al. | 430/5 |
| 5,960,107 A | * | 9/1999 | Leroux | 382/145 |
| 5,965,306 A | * | 10/1999 | Mansfield et al. | 430/22 |
| 5,985,497 A | * | 11/1999 | Phan et al. | 430/30 |
| 6,016,357 A | * | 1/2000 | Neary et al. | 382/144 |
| 6,166,801 A | * | 12/2000 | Dishon et al. | 355/27 |
| 6,171,731 B1 | * | 1/2001 | Medvedeva et al. | 430/5 |
| 6,191,036 B1 | * | 2/2001 | Yu et al. | 438/689 |
| 6,197,456 B1 | * | 3/2001 | Aleshin et al. | 430/5 |
| 6,263,299 B1 | * | 7/2001 | Aleshin et al. | 703/5 |

(List continued on next page.)

OTHER PUBLICATIONS

Lang et al., "Automatic transfer of parametric FEM models into CAD–layout formats for top–down design of microsystems", Proceedings of European Design and Test Conference, Mar. 17, 1997, pp. 200–204.*

Berger, Andrew; "*Recent Advances in SEM and CDSEM*"; http://www.cse.scu.edu/seminars/old/abstracts/bergers00.html; viewed on Jan. 26, 2001, p. 1.

Kirchauer, Heinrich; "*3.2.1 Focus Effects and Process Window*"; http://www.iue.tuwien.ac.at/kirchauer/diss new/node41.html; Viewed Jan. 26, 2001, pp. 1–2.

*Primary Examiner*—Vuthe Siek
*Assistant Examiner*—Phallaka Kik
(74) *Attorney, Agent, or Firm*—Amin & Turocy, LLP

(57) ABSTRACT

A method for new product mask evaluation is provided. Focus exposure matrices are printed at one or more layers (e.g., active gate) on full flow production wafers. The focus exposure matrices are then analyzed to produce data that facilitates detecting printed defects. The full flow production wafers are also subjected to end of line electrical testing to determine bit level errors. Print defects can be correlated with bit level errors to increase confidence in detected defects. The method includes a hierarchy of testing layers, each of which produce data that can be employed in detecting defects in a reticle and/or producing a yield analysis. The method involves scanning a reticle upon which the new product mask is etched and performing a printability simulation to determine what affect, if any, detected reticle defects will have on printing defects on a wafer. After the reticle is scanned, full flow production wafers printed from the pattern on the reticle can be scanned for defects, as can resist-on-silicon flat test wafers, where a higher signal to noise ratio facilitates detecting defects that may otherwise not be detected. The reticle scanning can include critical dimension measuring by scanning electron microscopy means and/or scatterometry means.

27 Claims, 8 Drawing Sheets

U.S. PATENT DOCUMENTS 6,268,093 B1 * 7/2001 Kenan et al. .................. 430/30
6,297,879 B1 * 10/2001 Yang et al. .............. 356/237.5
6,316,150 B1 * 11/2001 Gianoulakis et al. .......... 430/5
6,327,023 B1 * 12/2001 Bukofsky et al. ............. 355/53
6,370,679 B1 * 4/2002 Chang et al. ................. 716/19
6,374,397 B1 * 4/2002 Miyamoto et al. ............ 716/21
6,388,736 B1 * 5/2002 Smith et al. .................. 355/53
6,393,602 B1 * 5/2002 Atchison et al. ............... 716/4
6,400,838 B2 * 6/2002 Watanabe ................... 382/144
6,453,452 B1 * 9/2002 Chang et al. .................. 716/8
2001/0012390 A1 * 8/2001 Watanabe ................... 382/144

* cited by examiner

FULL FLOW FOCUS EXPOSURE MATRIX ANALYSIS AND ELECTRICAL TESTING FOR NEW PRODUCT MASK EVALUATION

CROSS REFERENCE TO RELATED APPLICATION

The present application claims the benefit of U.S. Provisional Patent Application Ser. No. 60/232,976, filed Sep. 14, 2000, entitled THE USE OF PRODUCT WAFER FOCUS EXPOSURE MATRIX FOLLOWED BY ELECTRICAL TESTING AS A METHOD OF NEW PRODUCT EVALUATION.

TECHNICAL FIELD

The present invention generally relates to semiconductor processing, and in particular to a method and system for evaluating new product masks that includes detecting defects on a reticle containing the new product mask and evaluating the yield impact of such defects.

BACKGROUND OF THE INVENTION

In the semiconductor industry, there is a continuing trend toward higher device densities and smaller device dimensions, which requires new product masks with ever smaller and ever more precise details. Producing a high yield of wafers with such higher densities and smaller dimensions through such new product masks depends, at least in part, on the manufacturing process window achieved during the processing of different lithography layers. Such process window depends in turn, at least in part, on defects on reticles employed in producing a wafer. Such reticle defects can include "soft" reticle defects, which lead to marginal printing. With the increasing use of advanced reticle enhancement techniques, the effect of defects, even soft reticle defects in new product masks, can be magnified when transferred to a wafer.

Conventionally, early in the wafer production process, lithography quality assurance engineers will run test wafers with focus exposure matrices to determine lithography process windows. Later in the wafer production process, development quality assurance personnel may run critical dimension (CD) splits at key layers to determine how variations are affecting the product performance. But each of these techniques suffer from drawbacks. For example, undersized contacts resulting from either repair, chrome defect or particle problems may not be detected, particularly when die-to-die comparisons are not available.

Analyzing a focus exposure matrix (FEM) on flat test wafers that have not been exposed to other topography influencing processes (e.g., deposition, etching) may not account for problems experienced due to such topography, and may similarly not account for interactions with non-lithography modules. Similarly, examining a critical dimension (CD) split exposes but a part of the lithography process space, and may leave certain defects undetected. Thus, some reticle defects associated with new product masks may not be detected using these conventional methods. Further, even if a reticle defect is detected using these conventional methods, analyses concerning the effects, if any, on the production yield may not be performed, and thus manufacturing, repairing, and/or scrapping decisions may be made. Thus, a method for evaluating new products masks, which includes detecting reticle defects and predicting the effect of such reticle defects on production yields of wafers printed using such a defective reticle is still required.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for printing Focus Exposure Matrices (FEMs) on full flow production wafers as part of a hierarchy of Quality Assurance (QA) testing. FEMs can be formed from a plurality of patterns created with varying resist exposure dosages and stepper focuses. Thus, pattern shapes and/or line widths in the FEMs can vary within one wafer, which facilitates collecting data suitable for comparison analysis. Printing and analyzing such FEMs facilitates evaluating new product masks by facilitating detecting reticle defects and predicting product yields when a reticle with detected defects is employed to print wafers. The full flow production wafers, (printed by the reticle containing the new product mask being evaluated), upon which the FEMs are printed at one or more different processing steps, are subjected, in addition, to end of line electrical testing, critical dimension measurement and analysis. The reticle is also subjected to a defect scan and a reticle scan that in turn lead to a printability simulation. Thus, reticle defects which may not be detected by conventional systems can be located, and analysis concerning the effects, if any, on production yield are facilitated.

At least two hurdles exist in evaluating a new product mask: detecting errors on the reticle and understanding the yield impact of defects. Lithography engineers employ reticle inspection tools to detect the existence of reticle defects. In the mask shop, reticle scans coupled with printability simulations can be employed to acquire first data. Then, in the Fab, engineers may employ automated defect inspection tools to review printed wafers, including wafers printed with FEMs, and to acquire more data associated with critical dimension measurements, for example. Finally, electrically testing FEM wafers can provide even more data that is suitable for defect identification and production yield analysis. To enable yield comparison, FEMs are printed on defective layers in full-flow production wafers, which facilitates comparisons with non-defective wafers. Such comparisons between empirically measured process windows and actual functional dies allows evaluation of the true process space when the lithography defect is combined with in-line process variation outside of the lithography module.

The printability of reticle CD errors depends not only on the defect size, but also defect location, defect shape, and the proximity of the defect to other features. The effect of the defects may also be influenced by product specific sensitivity and interaction with non-lithographic modules. Thus, employing a method that incorporates data from analyses including analyzing FEMs on full flow production wafers facilitates improving new product mask evaluation and improving defect impact yield analysis.

Analyzing FEMs printed on full flow production wafers in conjunction with reticle scans and printability simulation, flat wafer monitoring, critical dimension measurement and analysis facilitates collecting information in a plurality of ways. For reticles with more than one die per field, printing FEMs on actual full flow production wafers provides process sensitivity information at a functional level. As the position in the process window is varied across the wafer, dies can be compared to neighboring dies to scan for early yield roll off. At the bit level, the multi-tiered analysis approach facilitates identifying defect hot spots that may only occur under certain process conditions.

In accordance with an aspect of the present invention, a method for new product mask evaluation is provided. The method includes scanning a reticle and performing a printability simulation based, at least in part, on the reticle scanning. The method also includes performing defect scans on the printed wafers and flat wafer photo track monitoring. The method further includes performing critical dimension measuring and printing then analyzing one or more FEMs on full flow production wafers. The full flow production wafers are then subjected to end of line electrical testing to facilitate further defect detection, even at the bit level. Data gathered during the analysis phases of the method are then employed in performing a product yield analysis.

Another aspect of the present invention provides a data packet adapted to be transmitted between two or more processes, the data packet containing defect analysis information and product yield information produced by a method for new product mask evaluation, where the method includes reticle scanning, printability simulating based, at least in part, on the reticle scanning, defect scanning, flat wafer photo track monitoring, critical dimension measuring, full flow product focus exposure matrix monitoring, end of line electrical testing, defect detection, and product yield analysis.

Another aspect of the present invention provides a system for new product mask evaluation. The system includes a wafer defect analyzer, a reticle defect scanner operably coupled to the wafer defect analyzer, a printability simulator operably coupled to the wafer defect analyzer, a defect scanner operably coupled to the defect analyzer, a flat wafer monitor operably coupled to the defect analyzer, a critical dimension monitor operably coupled to the defect analyzer, a full flow product focus exposure matrix monitor operably coupled to the defect analyzer, and an end of line electrical tester operably coupled to the defect analyzer. In another aspect of the present invention, a yield predictor is operably coupled to the system described above in this paragraph.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
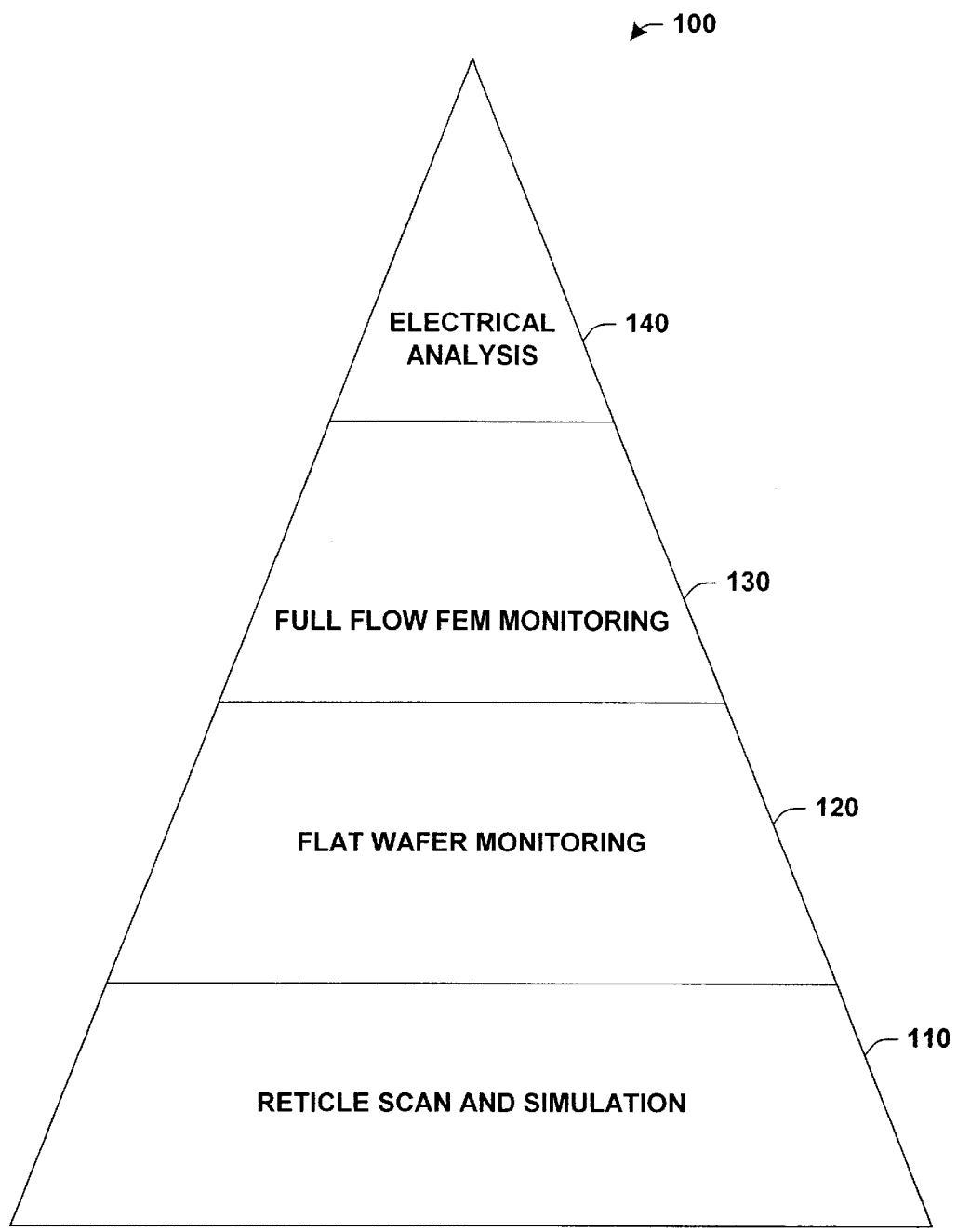
FIG. 1 is a schematic diagram of a hierarchy of testing employed in accordance with an aspect of the present invention.

The present invention will now be described with reference to the drawings, wherein like reference numerals are used to refer to like elements throughout. The present invention will be described with reference to a system for controlling oxide and/or nitride formation using one or more oxide/nitride formers and a scatterometry system. It should be understood that the description of these exemplary aspects are merely illustrative and that they should not be taken in a limiting sense.

The term "component" refers to a computer-related entity, either hardware, a combination of hardware and software, software, or software in execution. For example, a component may be a process running on a processor, a processor, an object, an executable, a thread of execution, a program and a computer. By way of illustration, both an application running on a server and the server can be components. A component may reside in one physical location (e.g., in one computer) and/or may be distributed between two or more cooperating locations (e.g., parallel processing computer, computer network).

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks may be employed.

Referring initially to FIG. 1, a hierarchy 100 of testing employed in evaluating a new product mask is evaluated. At the bottom 110 of the hierarchy 100 are actions associated with analyzing a reticle containing the new product mask. The actions at the bottom 110 of the hierarchy 100 can include, but are not limited to, scanning the reticle and performing printability simulations. At the next layers (120 and 130) of the hierarchy 100 are actions associated with analyzing a production wafer and/or test wafers as they are being processed, where such processing includes patterning the wafer by employing the reticle containing the new product mask. For example, at layer 120, flat wafer monitoring, including analyzing one or more focus exposure matrices on the flat wafer, can occur. At layer 130, analyzing one or more focus exposure matrices on a full flow product wafer can occur. Performing analyses on both test wafers and full flow production wafers facilitates collecting comparative data that in turn facilitates evaluating reticle defects in the context in a product and feature sensitive manner. Further, printing and then analyzing one or more focus exposure matrices on a full flow product wafer facilitates collecting data associated with defects that may only become apparent under actual production run conditions.

Finally, at the top 140 of the hierarchy 100, analyses performed on substantially completed wafers is undertaken. For example, analysis including, but not limited to, electrical analysis of circuits on the wafer can be undertaken. By employing a hierarchy 100 of testing, data that can be employed to detect reticle defects and to determine the effect on production yields can be collected from several processes in the processing cycle, which facilitates producing improvements in new product mask evaluation by improving reticle defect detection and product yield analysis, as compared to conventional systems.

In view of the exemplary systems shown and described below, a methodology, which may be implemented in accordance with the present invention, will be better appreciated with reference to the flow diagrams of FIG. 2 and 7. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

Figure 2:
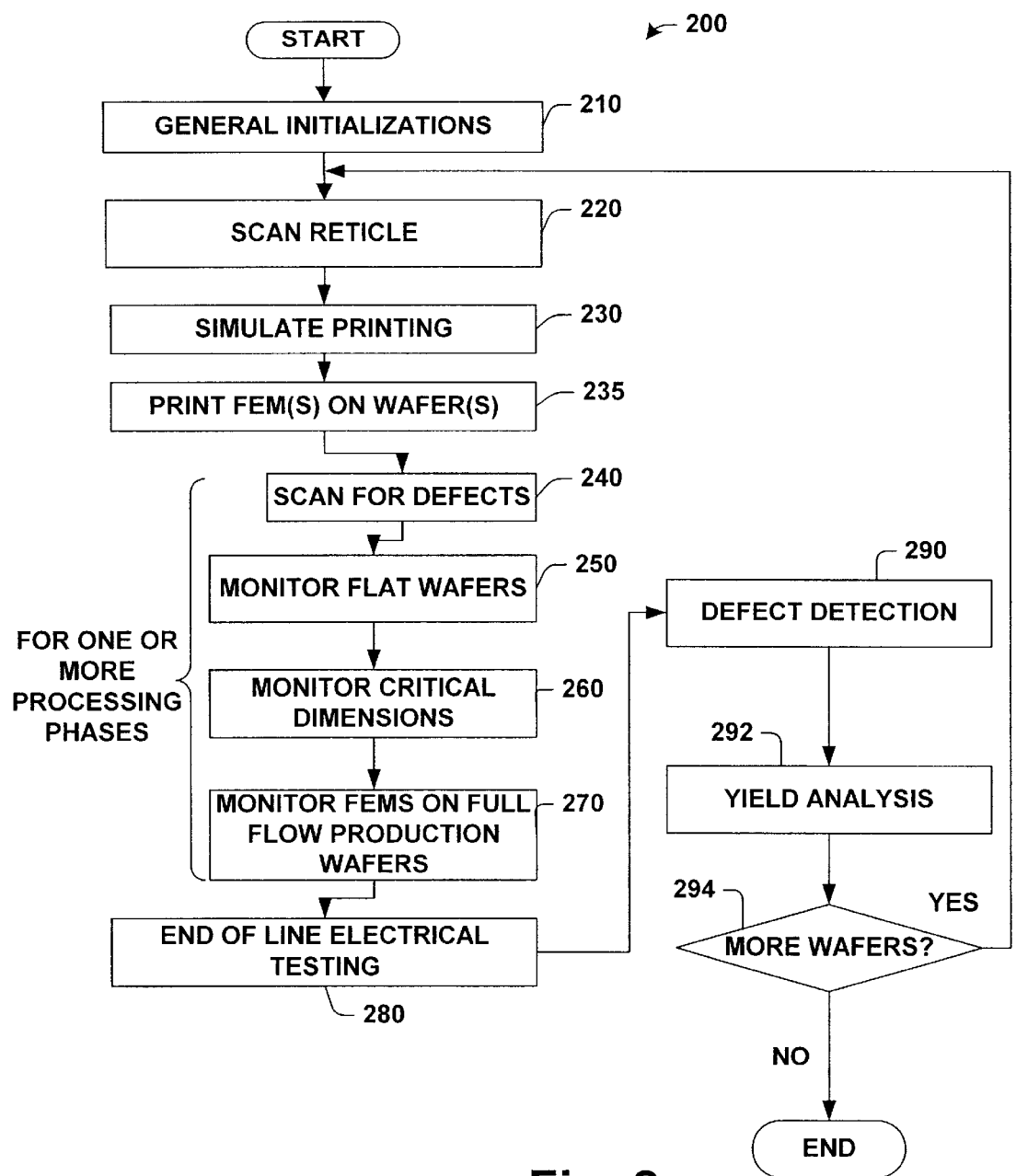
FIG. 2 is a flow diagram illustrating one specific methodology for carrying out the present invention.

FIG. 2 is a flow diagram illustrating one particular methodology 200 for carrying out the present invention. At block 210, general initializations are performed. Such initializations can include, but are not limited to, allocating memory, establishing pointers, establishing data communications, initializing variables, initializing data structures and instantiating objects. At block 220, action is taken on a reticle containing a new product mask. At block 220, the reticle containing the new product mask is scanned. Such reticle scanning may be performed by devices including, but not limited to a KLA-Tencor STARlight™ system that employs simultaneous transmitted and reflected-light contamination inspection. At block 230, printability simulation is performed. Printability simulation involves off-line methods for predicting how features and defects in reticles will print on full flow production wafers. Light transmitted through a reticle can be processed by a photolithography simulator, which can produce predicted aerial images. Predicted critical dimensions can be calculated from the simulation and compared to data collected from later processes that measure actual critical dimensions. Such comparisons facilitate producing yield estimates.

At blocks 235 through 270, actions are performed on wafers as they are being produced. It will be understood by one skilled in the art that blocks 235 through 270 may be performed one or more times during one or more processing phases of a wafer. For example, an integrated circuit being fabricated on a wafer may include a plurality of layers. Blocks 235 through 270 may be performed for one or more of the plurality of layers. At block 235, one or more FEMs are processed onto a wafer. While one block 235 is illustrated, it is to be appreciated that one or more FEMs may be developed on one or more layers of an integrated circuit to be fabricated on a wafer. At block 240, a wafer and/or a pattern on a wafer exposed through the reticle containing the new product mask are scanned for defects. Such defect scanning can be performed by devices including, but not limited to, a KLA2132 processor, for example. The defect scanning of block 240 can produce data that can be correlated with data acquired during the reticle scan of block 220. Furthermore, data not retrieved by conventional systems, which do not print FEMs on full flow production wafers, may be acquired during the scan at 240. Such data may incorporate data that can only be acquired from full flow production wafers (e.g., topography dependent data, production run stepper and/or spin track conditions).

The KLA2132 wafer defect inspection tools may similarly be employed in flat wafer monitoring at block 250. Such flat wafer monitoring may include image qualification. Image qualification involves applying a patterned photoresist to a flat silicon wafer and then performing automated die-to-die defect inspection. By exposing a resist-on-silicon test wafer through the reticle containing the new product mask being evaluated, where the resist-on-silicon test wafers produce higher signal-to-noise ratios than full flow product wafers, the KLA2132 inspection tools can be run at different levels than those employed for analyzing full flow product wafers, which facilitates acquiring different data that facilitates detecting more defects than conventional systems. Photo Track Monitoring (PTM), or Photo Cell Monitoring (PCM) can be employed in such lithographic defect monitoring. It is to be appreciated, that flat wafers may be monitored at one or more of the processing phases through which an integrated circuit will pass during fabrication.

Techniques including, but not limited to manual Scanning Electron Microscope (SEM) review and scatterometry review can be employed to facilitate detecting repeating defects, which are indicative of reticle defects. A repeating defect is a defect that appears in multiple wafers at the same location. The repeating defect can be an indicator that a reticle has a defect, as opposed to the defect being caused by a one-time contamination problem or wafer-to-wafer variations.

At block 260, critical dimensions of features formed in one or more layers on the integrated circuit being fabricated on the wafer, where such fabrication employs the reticle containing the new product mask being evaluated, can be measured. Such critical dimensions may be compared to predicted critical dimensions, where such predictions were made during block 230. Measuring critical dimensions is well known in the art and thus, for the sake of brevity is not discussed herein.

At block 270, one or more Focus Exposure Matrices (FEMs) printed on full flow production wafers may be analyzed. FEMs can be printed on layers including, but not limited to, gate oxide layers, field oxide layers and contact layers, for example. Analysis can be performed for FEMs located upon each layer wherein the FEMs are printed. By printing FEMs on full flow production wafers, with production topography produced by production processing, rather than solely on test and/or flat wafers, data points not conventionally retrieved may be acquired. Such data can facilitate detecting defects not detected by conventional systems. Furthermore, such data is suitable for comparison to printability simulation data to facilitate predicting production yields. Furthermore, data retrieved from such context sensitive processing can be employed to detect reticle defects that may only appear on production wafers, and that would not appear on flat "test" wafers.

At blocks 280 through 290, actions are performed on wafers that are substantially complete. At block 280, end of line electrical testing can be performed upon full flow production wafers upon which FEMs have been printed and/or analyzed. The end of line electrical testing of block 280 can include, but is not limited to, bit level failure analysis that facilitates aggregating bit level data across multiple non-functional dies. Correlating data between multiple dies facilitates identifying reticle defects that may go undetected by conventional systems. At block 290, reticle defect detection based on data collected during the preceding steps may occur. For example, correlating potential reticle detect defect data gathered during block 220 with wafer defect coordinate data gathered at block 280 may facilitate identifying reticle defects that maybe undetected if no such correlation were performed. Employing such correlations provides yet another improvement over conventional systems. It is to be understood that while coordinate correlation is provided as one example of data processing that can be employed in defect detection at block 290, that other correlations of data collected at different blocks may be employed in accordance with the present invention. For example, defect scan data collected at block 240 while may be correlated with bit level error data collected at block 280. Similarly, FEM related data and analysis collected and/or performed at block 270 may be correlated with data from the end of line electric testing of block 280.

In one example of the present invention, at block 292, a yield analysis is performed. It is to be appreciated that in other examples of the present invention, the yield analysis of block 292 may be omitted. Reticle defect detection data can be processed in association with printability simulation data and actual wafer defect detection data to produce predictions concerning anticipated yields when wafers are processed using the new product mask incorporated into the reticle evaluated in blocks 210 through 290. For example, a first detected defect in the new product mask may be predicted to lead to a ten percent reduction in yield, due to the location of the defect and the relationship of the defect to surrounding features while a second detected defect may be predicted to lead to a forty percent reduction in yield due to a different size, shape and/or location of the defect. Data gathered from FEMs printed on full flow production wafers, and analysis associated with such data facilitates generating a confidence level in the predictions of block 292, thus facilitating decisions concerning whether to use the reticle with the new product mask, to discard the reticle, or to attempt repairs of the reticle, which provides improvements over conventional systems.

Figure 3:
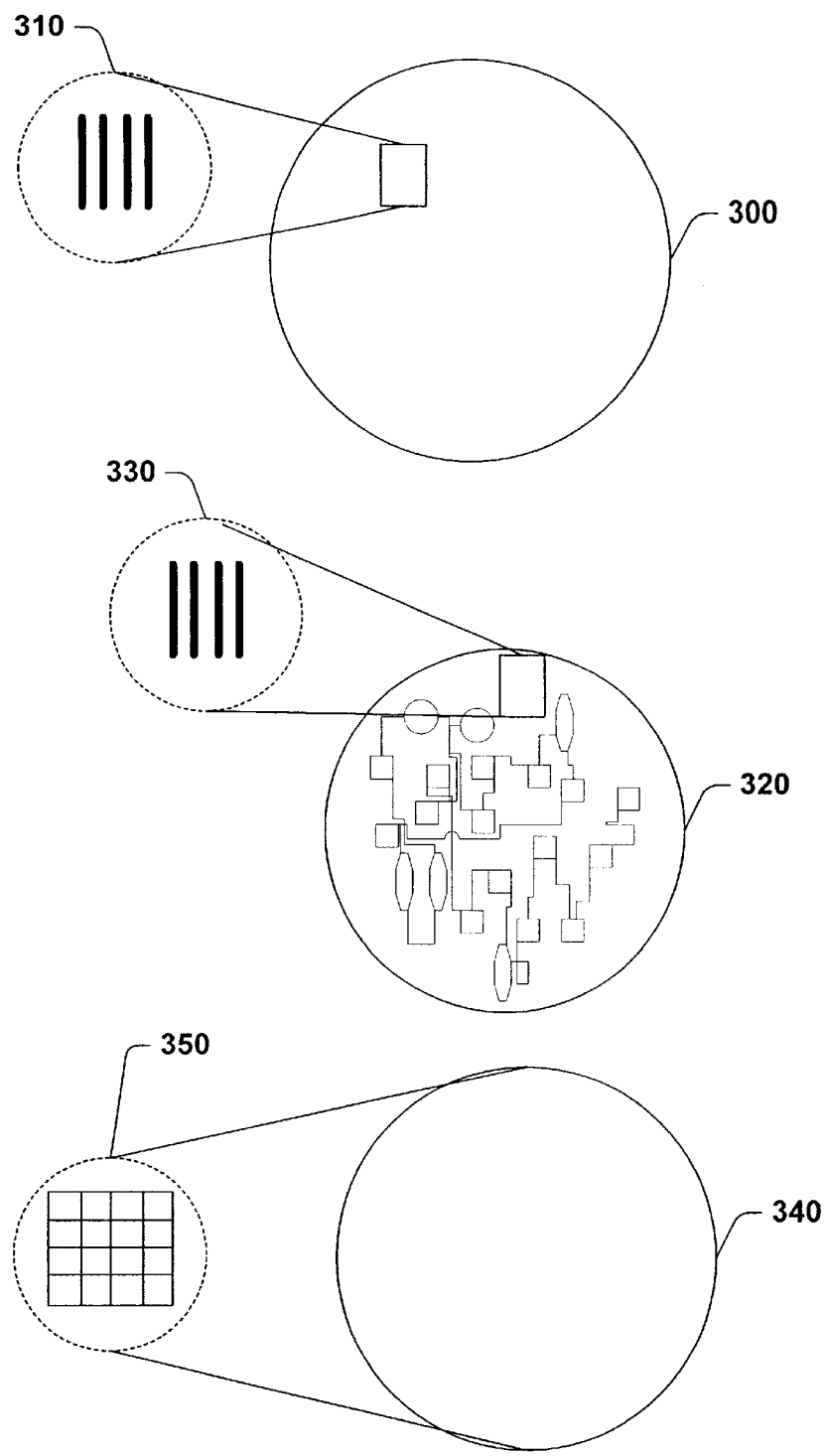
FIG. 3 is a top view of a wafers imprinted with a focus exposure matrix, in accordance with an aspect of the present invention.

FIG. 3 is a top view of a flat test wafer 300 with a focus exposure matrix 310 imprinted thereon. FIG. 3 also includes a top view of a full flow production wafer 320 with a focus exposure matrix 330 imprinted thereon and a wafer 340 with a focus exposure matrix 350 printed thereon. Printing and analyzing one or more FEMs 310 on a test wafer 300 facilitates collecting certain types of data while printing and analyzing one or more FEMs 330 on a full flow production wafer 320 facilitates collecting other types of data. By way of illustration, image qualification involves applying a patterned photoresist to a flat silicon wafer and then performing automated die-to-die defect inspection. By exposing a resist-on-silicon test wafer 300 with the reticle being examined, where such resist-on-silicon test wafers 300 have higher signal-to-noise ratios than full flow product wafers, inspection tools can be run at levels that cannot be employed with full flow production wafers 320, which facilitates detecting defects. By way of further illustration, analyzing FEMs 330 on full flow production wafers 320 provides data that cannot be gathered from test wafers 300 that have not undergone the same processing steps as the full flow production wafer 320 and which do not have the topography resulting from lithography processes (e.g., deposition, development, etching) on the full flow production wafer 320. For example, defects that may be detected based on proximity to features may be detected by analyzing the FEM 330, while such a defect may not be detected on the test wafer 300, because no neighboring triggering feature is present.

FIG. 3 also illustrates a wafer 340 upon which an FEM 350 is printed. The FEM 350 is illustrated as a series of intersecting lines. The FEM 310 and the FEM 330 are illustrated as a series of parallel lines. It is to be appreciated that the FEMs 310, 330 and 350 are merely illustrative, and that an FEM may be formed from one or more lines, circles and/or other geometric shapes. FEMs can also be formed from a plurality of patterns created with varying resist exposure dosages and stepper focuses. Thus, the pattern shapes and/or line widths can vary within one wafer, which facilitates collecting data suitable for comparison analysis.

Figure 4:
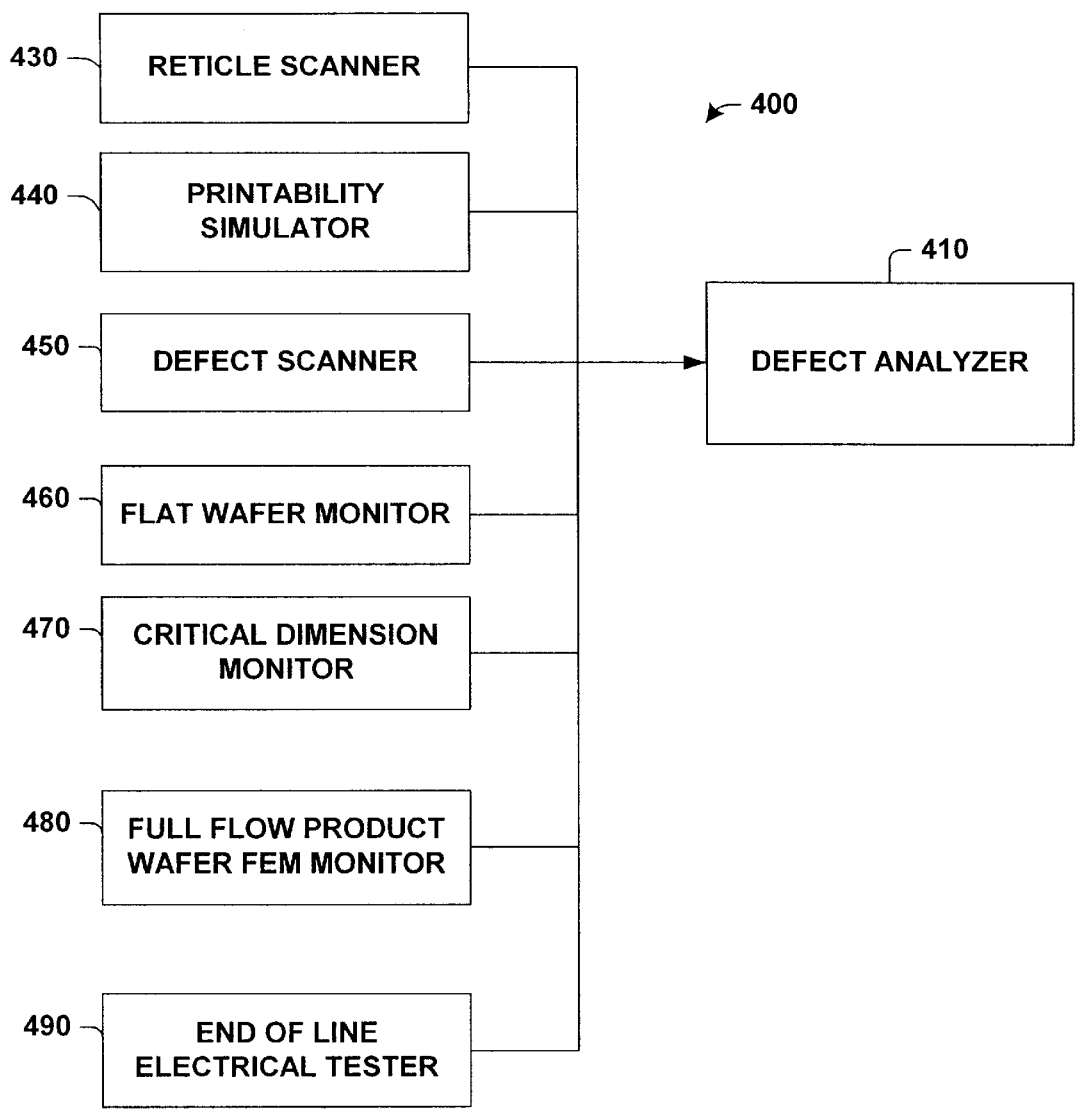
FIG. 4 is a schematic block diagram illustrating a system for evaluating new product masks, the system detecting reticle defects, in accordance with an aspect of the present invention.

FIG. 4 is a schematic block diagram illustrating a system 400 for evaluating a new product mask, where the system detects reticle defects. The system 400 includes a defect analyzer 410 that can receive analysis data from one or more reticle and/or wafer analyzing components and perform analyses that produce information concerning defects in new product masks. The system 400 includes a reticle scanner 430. The reticle scanner 430 may be, for example, a KLA-Tencor STARlight™ system that employs simultaneous transmitted and reflected-light contamination inspection. The reticle scanner 430 can produce data that is sent to the defect analyzer 410. Such data may include, but is not limited to, defects detected, defects suspected, and coordinates of such detected and/or suspected defects.

The system 400 includes a printability simulator 440 adapted to produce images simulating one or more patterns on a wafer printed with the reticle scanned by the reticle scanner 430. Data from the reticle scanner can be forwarded to the defect analyzer 410. Images produced by the printability Simulator 440 facilitate detecting defects in the new product mask on the reticle that may produce defects in the pattern exposed on the wafer. But the printability simulator 440 may not detect all the defects in a reticle. Thus, the system 400 includes a defect scanner 450 that can be employed to scan a pattern exposed into a layer on a wafer for defects. Data from the defect scanner 450 is forwarded to the defect analyzer 410, and can be correlated with data from the printability simulator 440, for example, to facilitate evaluating the operation of the defect scanner 450 and the reticle scanner 430. By way of illustration, if the reticle scanner 430 determines that a defect exists at a certain location in the new product mask contained on the reticle scanned by the reticle scanner 430, then data collected by the defect scanner 450 can be employed to confirm that the reticle defect produces a print defect. Such confirmation may also be employed in evaluating the performance of the printability simulator 440. Data generated by the defect scanner 450 can similarly be forwarded to the defect analyzer 410.

The system 400 includes a flat wafer monitor 460. The flat wafer monitor 460 can be employed to collect data from test wafers that may not contain topographical features present in full flow product wafers. The flat wafer monitor may be, for example, a KLA2132 wafer defect inspection tool. The flat wafers may have one or more FEMs printed thereon. The FEMs printed on the flat wafers may be related to the FEMs printed on full flow product wafers, which facilitates comparing and contrasting data retrieved by analyzing such FEMs, with such comparison analysis facilitating isolating defects associated with topography and full flow production conditions (e.g., stepper parameters, spin track parameters). Data generated by the flat wafer monitor 460 can similarly be forwarded to the defect analyzer 410.

The system 400 includes a critical dimension (CD) monitor 470. Such CD monitors are well known in the art, and thus, for the sake of brevity, are not discussed herein. Data generated by the critical dimension monitor 470 can similarly be forwarded to the defect analyzer 410, to facilitate detecting defects in new product masks.

The system 400 includes a full flow product wafer FEM monitor 480. An FEM is formed from a plurality of patterns created with varying resist exposure dosages and stepper focuses. Thus, pattern shapes and/or line widths in the FEMs can vary within one wafer, which facilitates collecting data suitable for comparison analysis. Printing and analyzing such FEMs facilitates evaluating new product masks by facilitating detecting reticle defects and predicting product yields when a reticle with detected defects is employed to print wafers. Printing and then analyzing FEMs on full flow product wafers further facilitates collecting defect data related to topography and production process parameters (e.g., stepper parameters, spin track parameters). Data generated by the FEM monitor 480 can similarly be forwarded to the defect analyzer 410.

The system 400 includes an end of line electrical tester 490. The end of line electrical tester 490 can be employed to generate, for example, bit level failure analysis that facilitates aggregating bit level data across multiple non-functional dies. Correlating data between multiple dies facilitates identifying reticle defects that may go undetected by conventional systems. Data generated by the end of line electrical tester 490 can similarly be forwarded to the defect analyzer 410.

The defect analyzer 410 thus has data available from a plurality of sources, including the FEM monitor 480, which facilitates evaluating a new product mask, facilitating improvements over conventional systems.

Figure 5:
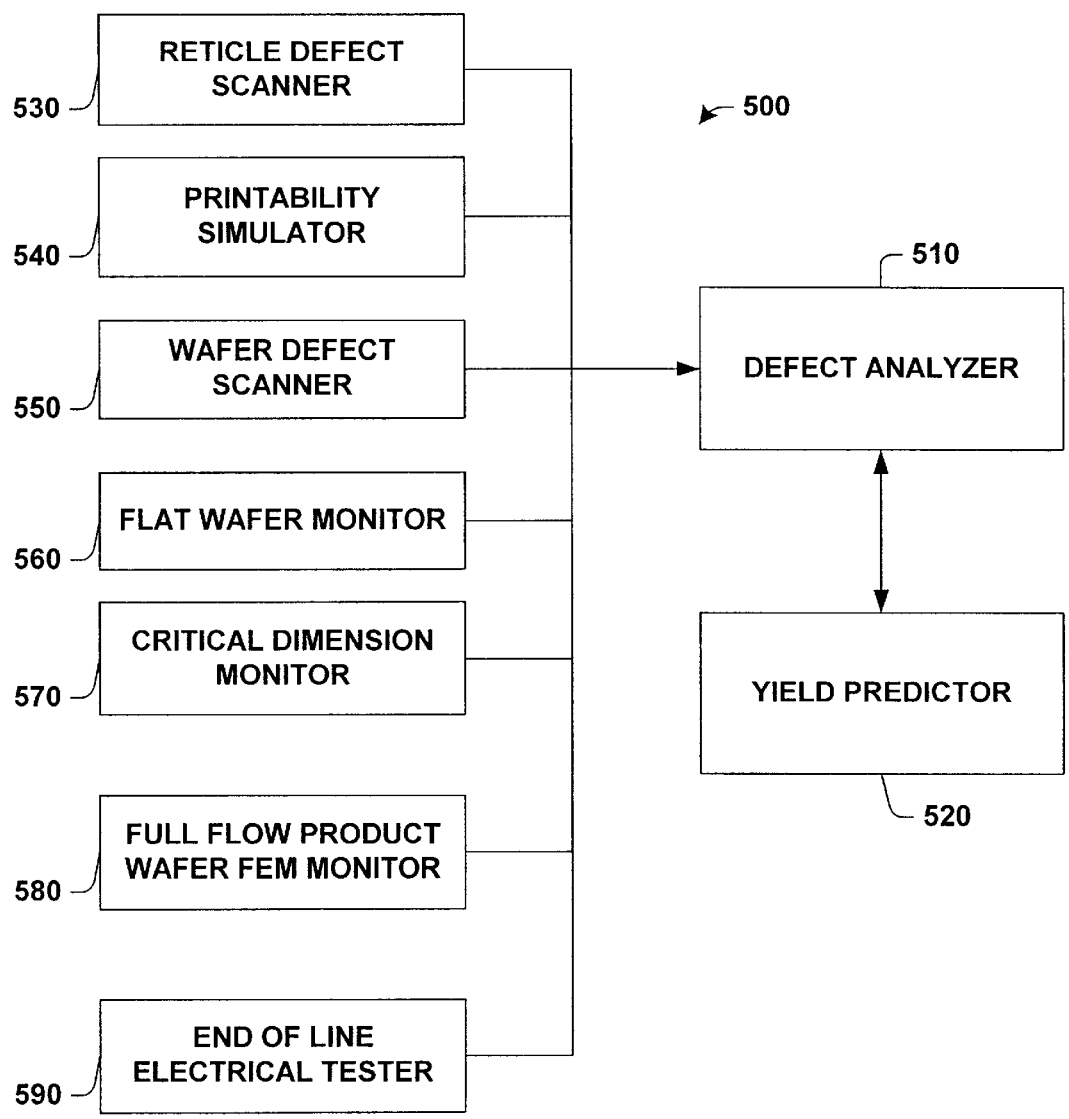
FIG. 5 is a schematic block illustrating a system for evaluating new product masks, the system detecting reticle defects and producing yield estimates, in accordance with an aspect of the present invention.

FIG. 5 is a schematic block illustrating a system 500 for evaluating a new product mask, where the system detects reticle defects and produces yield estimates. The system 500 includes a defect analyzer 510 that can receive analysis data from one or more reticle and/or wafer analyzing components. The system 500 includes a yield predictor 520 operably connected to the defect analyzer 510. The yield predictor 520 is adapted to output data concerning yields that can be expected if wafers are processed using a new product mask evaluated by the defect analyzer 510. By way of illustration, a first defect detected in the new product mask may be predicted to lead to a ten percent reduction in yield, due to the location of the defect and the relationship of the defect to surrounding features. A confidence level associated with the prediction can be achieved by comparing the predicted yield with actual yields from full production wafers analyzed by the present invention. By way of further illustration, a second detected defect may be predicted to lead to a forty percent reduction in yield due to a different size, shape and/or location of the defect, and data collected from FEMs analyzed on full flow production wafers and/or flat wafers. With such predictions, and such confidence levels in such predictions, decisions concerning fabricating integrated circuits by employing the new product mask are facilitated. By way of illustration, if a high confidence exists in a prediction that sixty percent of integrated circuits fabricated with a new product mask will have defects, then the new product mask may be discarded, and a new supplier of product masks may be sought. By way of further illustration, if a high confidence exists in a prediction that twenty percent of integrated circuits fabricated with a new product will have defects, then attempts may be made to repair the new product mask so that a lower, acceptable defect ratio is predicted. By way of still further illustration, if a high confidence exists in a prediction that five percent of integrated circuits fabricated with a new product will have defects, then the new product mask may be employed in a full production run. Thus, increases in integrated circuit manufacture efficiency may be achieved.

The system 500 includes a reticle scanner 530 that produces data that is sent to the defect analyzer 510. Such data may include, but is not limited to, defects detected, defects suspected, and coordinates of such detected and/or suspected defects.

The system 500 includes a printability simulator 540 adapted to produce images simulating one or more patterns on a wafer printed with the new product mask on the reticle scanned by the reticle scanner 530. Data from the reticle scanner can be forwarded to the defect analyzer 510. Images produced by the printability simulator 540 facilitate detecting defects in the new product mask on the reticle that may produce defects in the pattern exposed on the wafer. But the printability simulator 540 may not detect all the defects in a reticle. Thus, the system 500 includes a defect scanner 550 that can be employed to scan a pattern exposed into a layer on a wafer for defects. Data from the defect scanner 550 is forwarded to the defect analyzer 510, and can be correlated with data from the printability simulator 540, for example, to facilitate evaluating the operation of the defect scanner 550 and the reticle scanner 530. Data generated by the defect scanner 550 can similarly be forwarded to the defect analyzer 510.

The system 500 includes a flat wafer monitor 560. The flat wafer monitor 560 can be employed to collect data from test wafers that may not contain topographical features present in full flow product wafers. The flat wafers may have one or more FEMs printed thereon. The FEMs printed on the flat wafers may be related to the FEMs printed on full flow product wafers, which facilitates comparing and contrasting data retrieved by analyzing such FEMs, with such comparison analysis facilitating isolating defects associated with topography and full flow production conditions (e.g., stepper parameters, spin track parameters). Data generated by the flat wafer monitor 560 can similarly be forwarded to the defect analyzer 510.

The system 500 includes a critical dimension monitor 570. Such critical dimension monitors are well known in the art, and thus, for the sake of brevity, are not discussed herein. Data generated by the critical dimension monitor 570 can similarly be forwarded to the defect analyzer 510.

The system 500 includes a full flow product wafer FEM monitor 580. Data generated by the FEM monitor 580 can similarly be forwarded to the defect analyzer 510 to facilitate evaluating new product masks. The system 500 includes an end of line electrical tester 590. The end of line electrical tester 590 can be employed to generate, for example, bit level failure analysis that facilitates aggregating bit level data across multiple non-functional dies. Correlating data between multiple dies facilitates identifying reticle defects that may go undetected by conventional systems. Data generated by the end of line electrical tester 590 can similarly be forwarded to the defect analyzer 510 where it can be employed to facilitate evaluating new product masks.

The defect analyzer 510 thus has data available from a plurality of sources, including the FEM monitor 580, which facilitates evaluating a new product mask, facilitating improvements over conventional systems. The data collected from the plurality of sources an then be made available to the yield predictor 520, which can lead to improvements in integrated circuit manufacturing efficiency.

Figure 6:
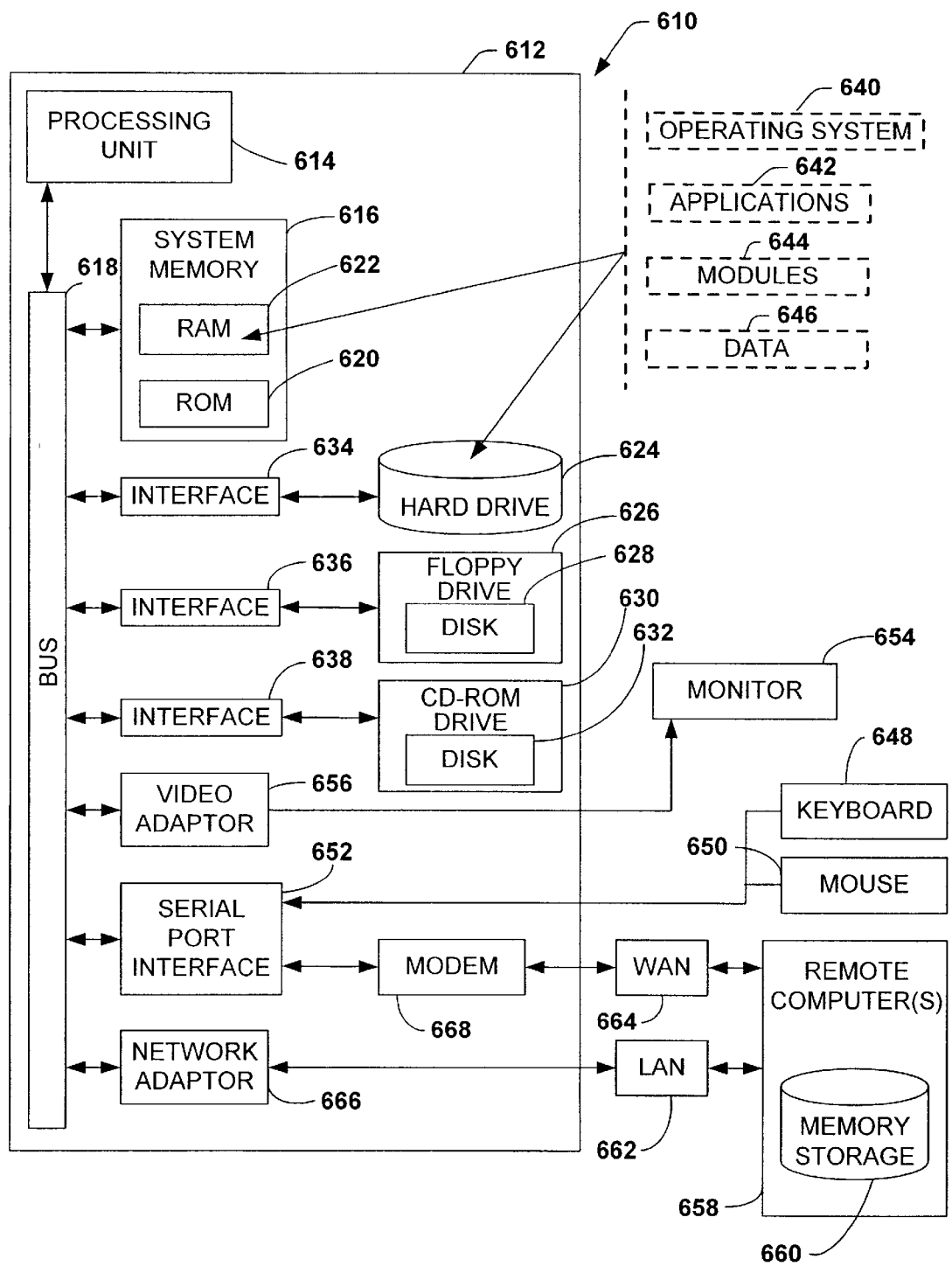
FIG. 6 is a schematic block diagram of an exemplary operating environment for a system configured in accordance with the present invention.

FIG. 6 is a schematic block diagram of an exemplary operating environment for a system configured in accordance with the present invention. In order to provide additional context for various aspects of the present invention, FIG. 6 and the following discussion are intended to provide a brief, general description of a suitable computing environment 610 in which the various aspects of the present invention may be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 6, an exemplary environment 610 for implementing various aspects of the invention includes a computer 612, the computer 612 including a processing unit 614, a system memory 616 and a system bus 618. The system bus 618 couples system components including, but not limited to, the system memory 616 to the processing unit 614. The processing unit 614 may be any of various commercially available processors. Dual microprocessors and other multi-processor architectures also can be employed as the processing unit 614.

The system bus 618 can be any of several types of bus structure including a memory bus or memory controller, a peripheral bus and a local bus using any of a variety of commercially available bus architectures. The system memory 622 includes read only memory (ROM) 620 and random access memory (RAM) 622. A basic input/output system (BIOS), containing the basic routines that help to transfer information between elements within the computer 612, such as during start-up, is stored in ROM 620.

The computer 612 further includes a hard disk drive 624, a magnetic disk drive 626, (e.g., to read from or write to a removable disk 628) and an optical disk drive 630, (e.g., for reading a CD-ROM disk 632 or to read from or write to other optical media). The hard disk drive 624, magnetic disk drive 626 and optical disk drive 630 can be connected to the system bus 618 by a hard disk drive interface 634, a magnetic disk drive interface 636 and an optical drive interface 638, respectively. The drives and their associated computer-readable media provide nonvolatile storage of data, data structures, computer-executable instructions, etc. for the computer 612, including for the storage of broadcast programming in a suitable digital format. Although the description of computer-readable media above refers to a hard disk, a removable magnetic disk and a CD, it should be appreciated by those skilled in the art that other types of media which are readable by a computer, such as zip drives, magnetic cassettes, flash memory cards, digital video disks, cartridges, and the like, may also be used in the exemplary operating environment, and further that any such media may contain computer-executable instructions for performing the methods of the present invention.

A number of program modules can be stored in the drives and RAM 622, including an operating system 640, one or more application programs 642, other program modules 644 and program data 646. It is to be appreciated that the present invention can be implemented with various commercially available operating systems or combinations of operating systems.

A user can enter commands and information into the computer 612 through a keyboard 648 and a pointing device, such as a mouse 650. Other input devices (not shown) may include a microphone, an IR remote control, a joystick, a game pad, a satellite dish, cameras, in the sense of gesture interpreted through cameras and machine-vision software, a scanner, or the like. These and other input devices are often connected to the processing unit 614 through a serial port interface 652 that is coupled to the system bus 618, but may be connected by other interfaces, such as a parallel port, a game port, a universal serial bus ("USB"), an IR interface, etc. A monitor 654 or other type of display device is also connected to the system bus 618 via an interface, such as a video adapter 656. In addition to the monitor, a computer typically includes other peripheral output devices (not shown), such as speakers, printers etc.

The computer 612 may operate in a networked environment using logical connections to one or more remote computers, such as a remote computer(s) 658. The remote computer(s) 658 may be a workstation, a server computer, a router, a personal computer, microprocessor based entertainment appliance, a peer device or other common network node, and typically includes many or all of the elements described relative to the computer 612, although, for purposes of brevity, only a memory storage device 660 is illustrated. The logical connections depicted include a local area network (LAN) 662 and a wide area network (WAN) 664. Such networking environments are commonplace in offices, enterprise-wide computer networks, intranets and the Internet.

When used in a LAN networking environment, the computer 612 is connected to the local network 662 through a network interface or adapter 666. When used in a WAN networking environment, the computer 612 typically includes a modem 668, or is connected to a communications server on the LAN, or has other means for establishing communications over the WAN 664, such as the Internet. The modem 668, which may be internal or external, is connected to the system bus 618 via the serial port interface 652. In a networked environment, program modules depicted relative to the computer 612, or portions thereof, may be stored in the remote memory storage device 660. It will be appreciated that the network connections shown are exemplary and other means of establishing a communications link between the computers may be used.

Figure 7:
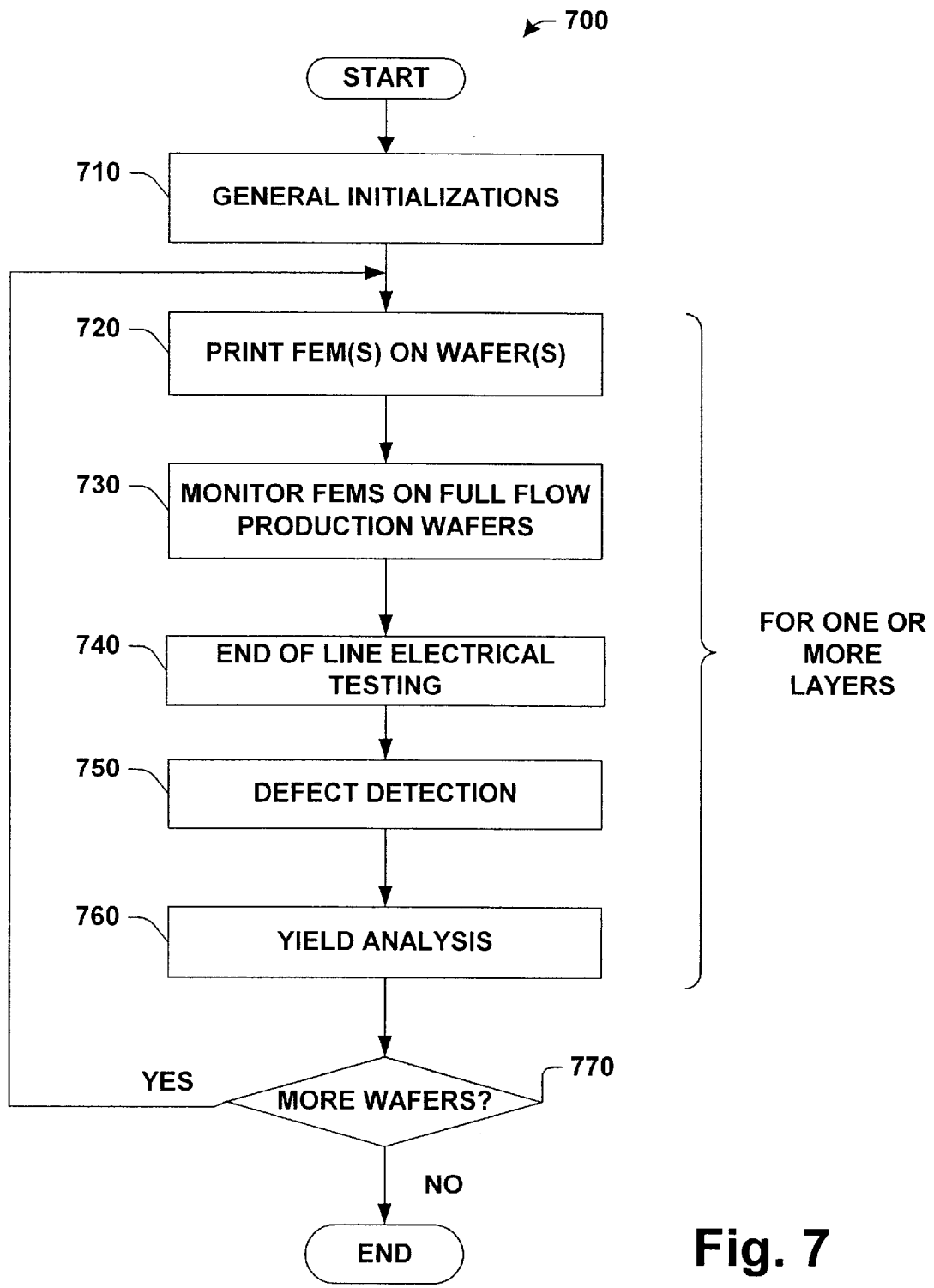
FIG. 7 is a flow diagram illustrating one specific methodology for carrying out the present invention.

Turning now to FIG. 7, a flow diagram illustrates one particular methodology 700 for carrying out the present invention. The methodology 700 involves combining FEM analysis with end of line electrical testing to facilitate new product mask evaluation.

At block 710, general initializations are performed. Such initializations can include, but are not limited to, allocating memory, establishing pointers, establishing data communications, initializing variables, initializing data structures and instantiating objects. At 720, one or more FEMs are printed on a full flow product wafer. The FEMs can be formed from a plurality of patterns created with varying resist exposure dosages and stepper focuses. The FEMs may be formed from one or more lines, circles and/or other geometric shapes.

At 730, the FEMs of block 720 are monitored for parameters including, but not limited to, size, shape, location, degree to which lines are parallel, degree to which lines are perpendicular, line length, line width and line area. Monitoring the FEMs for such parameters facilitates detecting printing defects due to defects in a new product mask.

At 740, the wafer upon which the FEMs have been processed can be subjected to electrical testing. During such electrical testing, integrated circuits manufactured, at least in part, in association with the new product mask being evaluated, are analyzed to determine whether desired electrical operation of the integrated circuit occurs or whether undesired operation occurs. The presence and/or absence of such undesired operation can be correlated with analysis performed on the FEMs to provide improved evaluation of new product masks as compared to conventional systems.

In one example aspect of the present invention, the defect detection of 750 can be followed at 760 by a yield analysis. A yield analysis may be undertaken to predict estimated yields of operable integrated circuits manufactured using the new product mask being evaluated. At 770, a determination is made concerning whether more wafers remain to be analyzed. If the determination at 770 is NO, then processing concludes, otherwise, if the determination at 770 is YES, then processing can return to 720.

Figure 8:
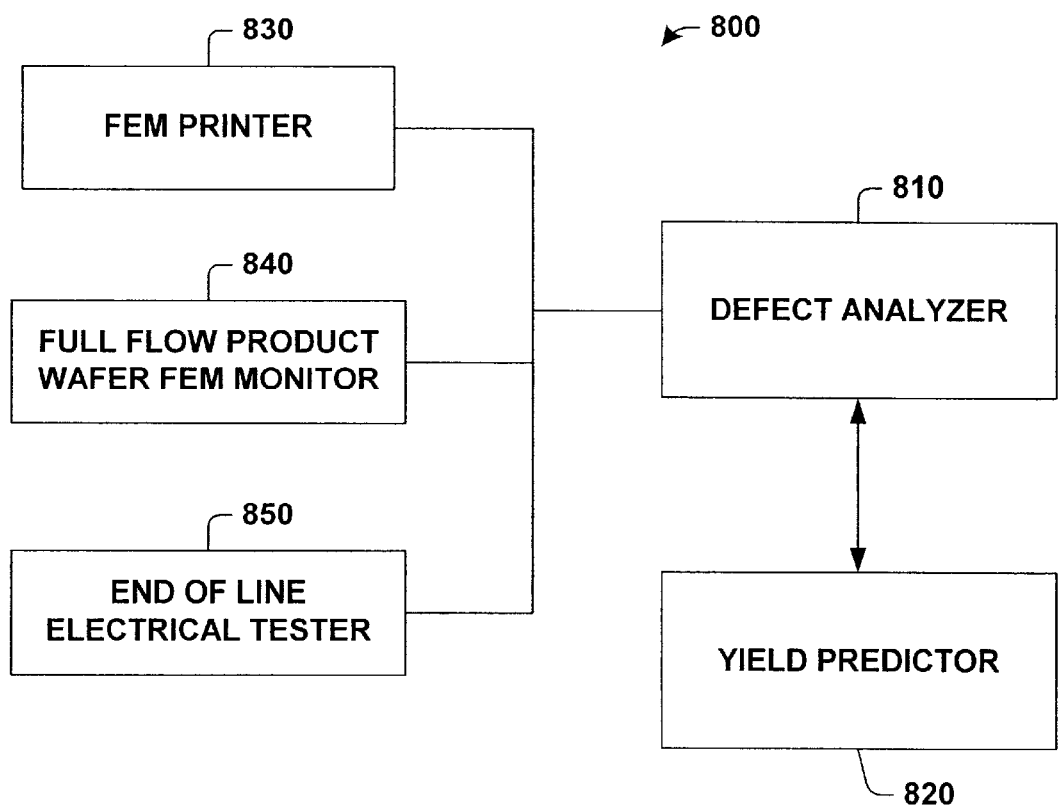
FIG. 8 is a schematic block diagram illustrating a system for evaluating new product masks in accordance with an aspect of the present invention.

Turning now to FIG. 8, a system 800 for evaluating a new product mask is illustrated. The system 800 includes a defect analyzer 810 that receives input from an FEM printer 830, a full flow product wafer FEM monitor 840 and an end-of-line electrical tester 850. The defect analyzer accepts such inputs, and produces an output concerning defects detected with a new product mask being analyzed.

The FEM printer 830 prints one or more FEMs on full flow product wafers. The FEMs can be formed from a plurality of patterns created with varying resist exposure dosages and stepper focuses. The FEMs may be formed from one or more lines, circles and/or other geometric shapes. The FEMs are processed so as to not interfere with the electrical operation of the one or more integrated circuits being fabricated on the wafer on which the FEMs are processed.

The full flow product wafer FEM monitor 840 can monitor one or more FEMs for parameters including, but not limited to, size, shape, location, degree to which lines are parallel, degree to which lines are perpendicular, line length, line width and line area. Monitoring the FEMs for such parameters facilitates detecting printing defects due to defects in a new product mask, and thus leads to improved quality control in integrated circuit manufacture.

The end of line electrical tester 850 can test integrated circuits exposed to the new product mask being evaluated, to determine whether desired electrical operation of the integrated circuit occurs or whether undesired operation occurs. The presence and/or absence of such undesired operation can be correlated with analysis performed on the FEMs to provide improved evaluation of new product masks as compared to conventional systems, which in turn leads to improved integrated circuit quality assurance.

The defect analyzer 810 can pass through data collected from the FEM printer 830, the full flow product wafer FEM monitor 840 and the end-of-line electrical tester 850 and/or data derived from such data, to a yield predictor 820. The yield predictor 820 can then be employed to determine estimated yields of integrated circuits fabricated using the new product mask being evaluated. Thus, decisions concerning the disposition of a new product mask (e.g., employ, repair, destroy) are facilitated, and integrated circuit manufacture can benefit from increased efficiency.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for new product mask evaluation, comprising:

reticle scanning;

printability simulating based, at least in part, on the reticle scanning;

printing one or more focus exposure matrices on a full flow production wafer;

defect scanning;

flat wafer monitoring;

critical dimension measuring;

full flow production wafer focus exposure matrix monitoring;

end of line electrical testing; and defect detecting.

2. The method of claim 1, further comprising product yield analyzing.

3. The method of claim 2, wherein the reticle scanning is performed by at least one of a reticle defect inspection tool and a die-to-die inspection tool.

4. The method of claim 2, wherein the printability simulating produces a prediction yield data correlating one or more detected reticle defects to a of one or more defects being printed on a wafer, wherein the wafer is printed using the new product mask being evaluated.

5. The method of claim 2, wherein the defect scanning includes image qualifying, wherein a patterned photoresist is applied to a flat silicon wafer to produce a resist-on-silicon wafer, and wherein the resist-on-silicon wafer is inspected for defects on a die-to-die basis, wherein a resist-on-silicon signal to noise ratio is higher than a signal to noise ratio on the full flow production wafer.

6. The method of claim 5, wherein the flat wafer monitoring includes at least one of Photo Track Monitoring (PTM) and Photo Cell Monitoring (PCM).

7. The method of claim 2, wherein the critical dimension measuring is performed by scatterometry.

8. The method of claim 2, wherein the critical dimension measuring is performed by scanning electron microscopy.

9. The method of claim 2, wherein the full flow production wafer focus exposure matrix monitoring occurs on at least one of a field oxide layer, a contact layer and a gate oxide layer.

10. The method of claim 2, wherein the end of line electrical testing includes a bit level failure analysis yielding bit level data across a plurality of dies.

11. The method of claim 2, wherein the product yield analyzing comprises:
  generating an actual yield data; and
  correlating the actual yield data with a prediction yield data.

12. The method of claim 1, wherein the focus exposure matrix is formed from a plurality of patterns created with varying resist exposure dosages and stepper focuses.

13. A data packet adapted to be transmitted between two or more processes, the data packet containing defect analysis information and product yield information produced by a method for new product mask evaluation, comprising:
  reticle scanning;
  printability simulating based, at least in part, on the reticle scanning;
  defect scanning;
  printing one or more focus exposure matrices on a full flow production wafer;
  flat wafer track monitoring;
  critical dimension measuring;
  full flow product focus exposure matrix monitoring;
  end of line electrical testing;
  defect detecting; and
  product yield analyzing.

14. A system for new product mask evaluation, comprising:
  a reticle scanner operably coupled to a defect analyzer;
  a printability simulator operably coupled to the defect analyzer;
  a defect scanner operably coupled to the defect analyzer;
  a flat wafer monitor operably coupled to the defect analyzer;
  a critical dimension monitor operably coupled to the defect analyzer;
  a full flow product focus exposure matrix monitor operably coupled to the defect analyzer; and
  an end of line electrical tester operably coupled to the defect analyzer.

15. The system of claim 14, further comprising a yield predictor operably coupled to the defect analyzer.

16. The system of claim 15, wherein the reticle scanner is at least one of a reticle defect inspection tool and a die-to-die inspection tool.

17. The system of claim 15, wherein the printability simulator is adapted to produce a prediction yield data correlating one or more scanned reticle defects to a likelihood of one or more defects being printed on a wafer, wherein the wafer is printed using the new product mask being evaluated.

18. The system of claim 15, wherein the defect scanner is adapted to perform image qualifying, wherein a patterned photoresist is applied to a flat silicon wafer to produce a resist-on-silicon wafer, and wherein the resist-on-silicon wafer is inspected for defects on a die-to-die basis, wherein a resist-on-silicon signal to noise ratio is higher than a signal to noise ratio on the full flow production wafer.

19. The system of claim 15, wherein the flat wafer monitor is at least one of a Photo Track Monitor and a Photo Cell Monitor.

20. The system of claim 15, wherein the critical dimension monitor is a scanning electron microscope system.

21. The system of claim 15, wherein the critical dimension monitor is a scatterometry system.

22. The system of claim 15, wherein the full flow product focus exposure matrix monitor is adapted to monitor one or more focus exposure matrices on at least one of a field oxide layer, a contact layer and a gate oxide layer.

23. The system of claim 22, wherein the focus exposure matrices are formed from a plurality of patterns created with varying resist exposure dosage s and stepper focuses.

24. The system of claim 15, wherein the end of line electrical tester is adapted to perform a bit level failure analysis yielding bit level data across a plurality of dies.

25. The system of claim 15, wherein the yield predictor is adapted to:
  generate an actual yield data; and
  correlate the actual yield data with a prediction yield data.

26. A data packet adapted to be transmitted between two or more processes, the data packet containing defect detection information and product yield information produced by a system comprising:
  a defect analyzer;
  a reticle scanner operably coupled to the defect analyzer;
  a printability simulator operably coupled to the defect analyzer;
  a defect scanner operably coupled to the defect analyzer;
  a flat wafer monitor operably coupled to the defect analyzer;
  a critical dimension monitor operably coupled to the defect analyzer;
  a full flow product focus exposure matrix monitor operably coupled to the defect analyzer;
  an end of line electrical tester operably coupled to the defect analyzer; and
  a yield predictor operably coupled to the defect analyzer.

27. A method for new product mask evaluation, comprising:
  processing one or more focus exposure matrices (FEMs) onto a full flow product wafer;
  analyzing the FEMs;
  performing end of line electrical testing of one or more integrated circuits produced from the full flow product wafer upon which the one or more FEMs were processed; and
  performing a yield analysis in connection with determining an overall yield based, at least in part, on data associated with analyzing the FEMs and data associated with the end of line electrical testing of the one or more integrated circuits.

* * * * *